US008118483B2

United States Patent
Cox

(10) Patent No.: US 8,118,483 B2
(45) Date of Patent: Feb. 21, 2012

(54) THERMAL SENSOR HAVING TOGGLE CONTROL

(75) Inventor: Christopher E. Cox, Placerville, CA (US)

(73) Assignee: Intel Corporation, Santa Clara, CA (US)

(*) Notice: Subject to any disclaimer, the term of this patent is extended or adjusted under 35 U.S.C. 154(b) by 1642 days.

(21) Appl. No.: 11/472,823

(22) Filed: Jun. 21, 2006

(65) Prior Publication Data

US 2008/0007319 A1    Jan. 10, 2008

(51) Int. Cl.
G01K 7/00       (2006.01)
G01K 15/00      (2006.01)

(52) U.S. Cl. .............................. 374/170; 374/1; 374/178

(58) Field of Classification Search .............. 374/1, 170, 374/178
See application file for complete search history.

(56) References Cited

U.S. PATENT DOCUMENTS

| | | | | |
|---|---|---|---|---|
| 5,953,685 A * | 9/1999 | Bogin et al. | .................. | 702/136 |
| 6,134,167 A * | 10/2000 | Atkinson | ...................... | 365/222 |
| 6,173,217 B1 * | 1/2001 | Bogin et al. | .................. | 700/299 |
| 6,546,343 B1 * | 4/2003 | Batra et al. | ...................... | 702/64 |
| 6,564,288 B2 * | 5/2003 | Olarig et al. | .................. | 711/105 |
| 7,051,222 B2 | 5/2006 | Wyatt et al. | | |
| 7,304,857 B2 | 12/2007 | Yamashita | | |
| 7,412,614 B2 * | 8/2008 | Ku | ............................... | 713/321 |
| 2003/0191888 A1 * | 10/2003 | Klein | ............................. | 711/105 |
| 2003/0210247 A1 | 11/2003 | Cui et al. | | |
| 2004/0001527 A1 | 1/2004 | Grannes et al. | | |
| 2004/0024561 A1 | 2/2004 | Huckaby et al. | | |
| 2005/0001670 A1 | 1/2005 | Kim et al. | | |
| 2005/0259496 A1 | 11/2005 | Hsu et al. | | |
| 2006/0044910 A1 | 3/2006 | Chang | | |
| 2006/0066384 A1 | 3/2006 | Hsu et al. | | |
| 2006/0190210 A1 * | 8/2006 | Mukherjee | ..................... | 702/130 |
| 2007/0007992 A1 * | 1/2007 | Bains et al. | ..................... | 326/30 |
| 2007/0030019 A1 * | 2/2007 | Kinsley | ......................... | 324/760 |
| 2007/0106860 A1 * | 5/2007 | Foster et al. | .................. | 711/170 |
| 2008/0043556 A1 * | 2/2008 | Nale | ............................. | 365/212 |
| 2011/0055671 A1 * | 3/2011 | Kim et al. | ..................... | 714/800 |

FOREIGN PATENT DOCUMENTS

| | | |
|---|---|---|
| EP | 0851427 | 7/1998 |
| TW | 200625065 | 7/2006 |
| TW | 200634984 | 10/2006 |
| WO | WO 00/04481 | 1/2000 |

OTHER PUBLICATIONS

Combined Search and Examination Report for corresponding foreign matter P24125GB.
Pending U.S. Appl. No. 11/093,705, filed Mar. 30, 2005, inventor: Shi et al.

(Continued)

Primary Examiner — Lisa Caputo
Assistant Examiner — Mirellys Jagan
(74) Attorney, Agent, or Firm — Blakely, Sokoloff, Taylor & Zafman LLP

(57) ABSTRACT

Embodiments of the invention are generally directed to systems, methods, and apparatuses for thermal sensor power savings using a toggle control. In some embodiments, an integrated circuit (e.g., a memory device) includes an on-die thermal sensor, a storage element (e.g., a register), and toggle logic. The toggle logic may transition the thermal sensor from a first power consumption level to a second power consumption level responsive, at least in part, to a toggle indication.

16 Claims, 6 Drawing Sheets

OTHER PUBLICATIONS

Pending U.S. Appl. No. 11/357,493, filed Feb. 16, 2006, inventor: Wyatt.
Pending U.S. Appl. No. 11/174,009, filed Jun. 30, 2005, inventor: Bains et al.
Pending U.S. Appl. No. 11/296,960, filed Dec. 7, 2005, inventor: Vergis et al.
Pending U.S. Appl. No. 11/296,993, filed 12-7-05, inventor: Cox et al.
Pending U.S. Appl. No. 11/296,950, filed Dec. 7, 2005, inventor: Cox et al.
Pending U.S. Appl. 11/396,277, filed Mar. 30, 2006, inventor: Oie et al.
Pending U.S. Appl. No. 11/093,905, filed Mar. 30, 2005, inventor: Jain et al.
Pending U.S. Appl. No. 11/305,519, filed Dec. 16, 2005, inventor: Wyatt.

Farrell: Core Architecture Doubles Mem Data Rate; 12 pages http://www.eetasia.com/ARTICLES/2005DEC/B/EEOL__2005DEC16__STOR_TA.pdf.
Iyer, et al: System Memory Power and Thermal Management Techniques in Mobile Platforms; Technology@Intel Magazine Mar. 2006, pp. 1-12.
System Memory Power and Thermal Management in Platforms Built on Intel Centrino duo Mobile Technology; Intel Tech Journal vol. 10, Issue 2; May 15, 2006; ISSN: 1535-864X 12.
"First Office Action for Chinese Patent Application No. 200710126497.1; Dated Apr. 3, 2009", Whole Document.
"Office Action for Chinese Patent Application No. 200710126497.1", (Jun. 24, 2010), Whole Document.
"Office Action for Japanese Patent Application No. 2007-158204", (Apr. 13, 2010), Whole Document.
"Office Action for Taiwan Patent Application No. 96122078", (Dec. 3, 2010), Whole Document.
"Office Action for Chinese Patent Application No. 200710126497.1", (May 20, 2011), Whole Document.

* cited by examiner

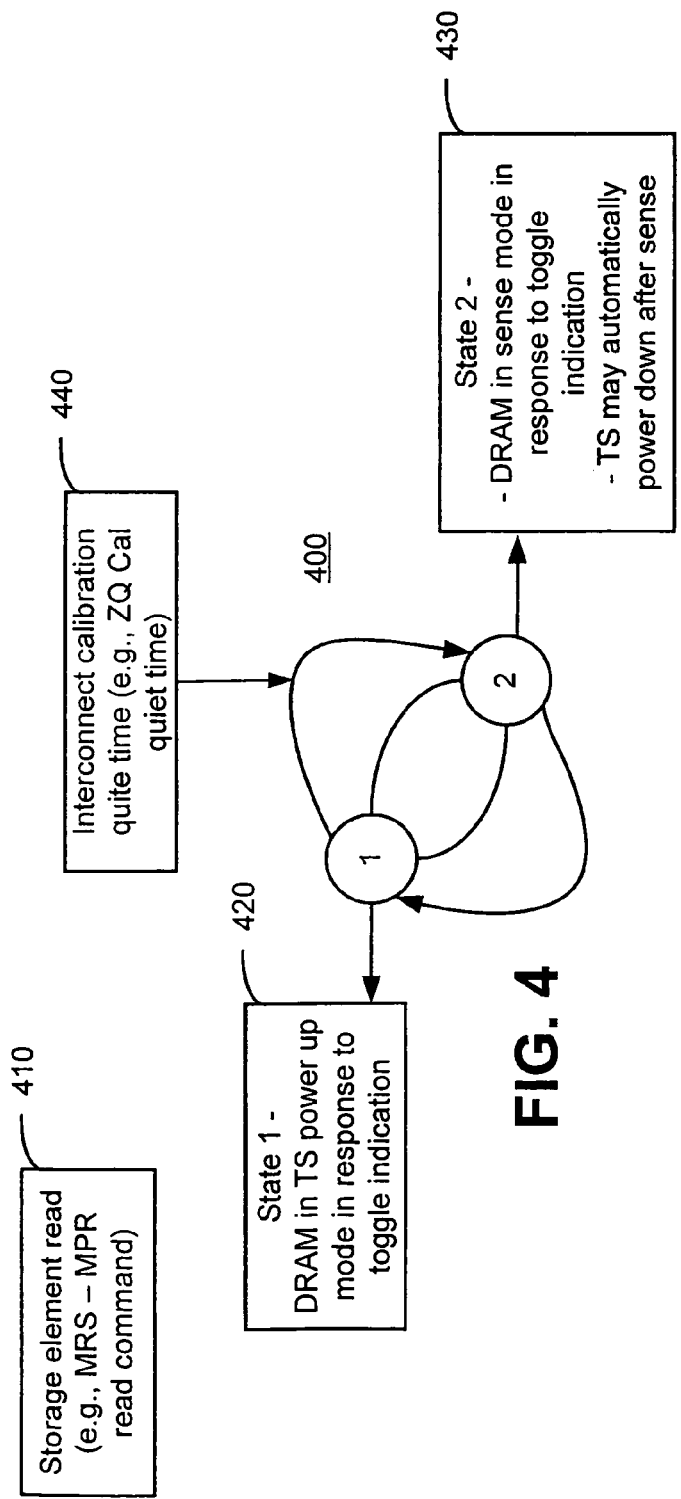

THERMAL SENSOR HAVING TOGGLE CONTROL

TECHNICAL FIELD

Embodiments of the invention generally relate to the field of integrated circuits and, more particularly, to systems, methods and apparatuses for a thermal sensor having toggle control to provide power savings.

BACKGROUND

Memory is frequently packaged on modules that contain several similar (or identical) integrated circuits such as dynamic random access memory (DRAM) devices. The temperature of a DRAM is largely determined by its activity level (e.g., the rate of reads and writes into the memory cells). If the temperature of the memory is too high, then the data stored in the memory may be corrupted or lost. In addition, the memory may be damaged by excessively high temperatures. Also, the thermal constraints of memory devices may limit the maximum data access rates that memory device interfaces can support.

On-die thermal sensors may be used to collect DRAM thermal data. In some systems, each DRAM may include an on-die thermal sensor to collect thermal data and to provide the collected thermal data to, for example, a memory controller. The on-die thermal sensors may be capable of triggering an event when a preprogrammed thermal threshold is reached.

In conventional systems, the on-die thermal sensors are powered on whenever the system is powered on. Since the on-die thermal sensors are always on, they are constantly consuming power. The constant consumption of power may deplete battery supplied power (e.g., in mobile applications) and may generate heat that needs to conducted away from the platform.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4 is a state diagram illustrating selected aspects of toggle logic according to an embodiment of an invention.

FIG. 5 is a table illustrating selected aspects of a storage element (e.g., aspects of a mode register set) according to an embodiment of the invention.

DETAILED DESCRIPTION

Embodiments of the invention are generally directed to systems, methods, and apparatuses for reducing the power consumption of an on-die thermal sensor by toggling the sensor from a higher power consumption level to a lower power consumption level under certain conditions. In some embodiments, an integrated circuit (e.g., a DRAM) includes an on-die thermal sensor and toggle logic. The purpose of the toggle logic is to toggle the sensor among two or more power consumption levels. In some embodiments, the toggle logic can reduce the power consumption of the sensor by transitioning the sensor to a lower power consumption level under certain conditions.

Figure 1:
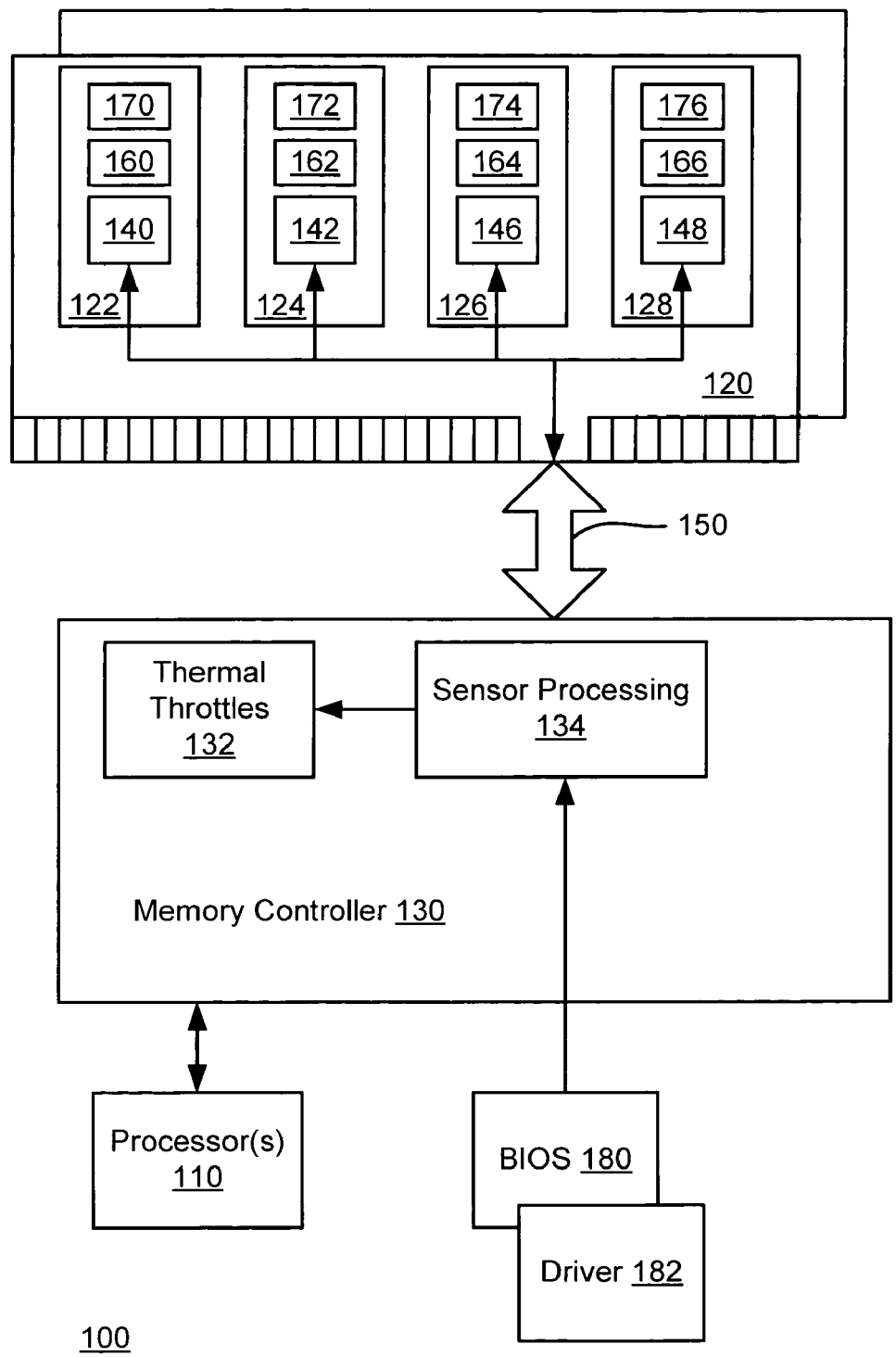
FIG. 1 is a high-level block diagram illustrating selected aspects of a computing system, implemented according to an embodiment of the invention.

FIG. 1 is a high-level block diagram illustrating selected aspects of a computing system implemented according to an embodiment of the invention. System 100 includes processor 110, memory module 120, and memory controller 130. Processor(s) 110 may be any processing element including, for example, a central processing unit, an embedded processor, a partitioned processor, a muticore processor, and the like.

Memory module 120 includes memory devices 122-128. For ease of illustration, four memory devices are shown. It is to be appreciated that embodiments of the invention may include more memory devices or fewer memory devices. Memory devices 122-128 may be any of a wide variety of memory devices including, for example, DRAMs.

In some embodiments, each memory device 122-128 includes a corresponding on-die thermal sensor 140-148. The term "on-die" refers to the disposition of a thermal sensor onto the same die as a corresponding integrated circuit (e.g., the same die as a DRAM). An on-die thermal sensor may be any of a wide range of on-die thermal sensors including, for example, a thermal diode. On-die thermal sensors 140-148 sense thermal data of memory devices 122-128. The term "thermal data" broadly refers to digitized information that provides an indication of device temperature. The term "thermal data" may also include digitized information that indicates whether one or more temperature thresholds have been crossed.

In the illustrated embodiment, each memory device 122-128 also includes corresponding toggle logic 160-166 and storage element 170-176. Toggle logic 160-166 includes logic to transition the corresponding thermal sensor among two or more power consumption levels. As the term suggests, a "power consumption level" refers to how much power the thermal sensor consumes. In some embodiments, different power consumption levels correspond to different states of the thermal sensor. For example, the power consumption level of a thermal sensor in a sense mode is greater than the power consumption level of the thermal sensor in a powered down mode. It is to be appreciated that a thermal sensor may have almost any number of power consumption levels and the granularity of the power consumption levels may be fine, coarse, or anywhere in between.

Toggle logic 160-166 may be implemented using almost any kind of logic suitable for transitioning a thermal sensor between power consumption levels. For example, toggle logic 160-166 may be implemented using a state machine. An example of toggle logic 160-166 is further discussed below with reference to FIGS. 3-5.

As shown in FIG. 1, each memory device 122-128 may also include a corresponding storage element 170-176. Storage elements 170-176 may store thermal data for corresponding thermal sensors 140-148. In some embodiments, for example, the thermal sensors 140-148 sense the thermal data and then pass the thermal data to storage elements 170-176.

In some embodiments, storage elements 170-176 may also store information to control a function of a thermal sensor and/or its associated toggle logic. For example, storage elements 170-176 may store one or more bits to indicate whether the on-die thermal sensor is enabled or disabled. As is further discussed below, storage elements 170-176 may store bits specifying whether a thermal sensor is to skip one or more toggle indications. Storage elements 170-176 may be any sort of storage element suitable for storing a number of bits including, for example, a register set. In some embodiments, storage elements 170-176 are mode register sets (MRSs). Storage elements 170-176 are further discussed below with reference to FIGS. 2 and 5.

In alternative embodiments, only a selected subset of memory devices 122-128 includes an on-die thermal sensor 140-148 and/or toggle logic 160-166. For example, in some embodiments, every Nth (e.g., second, third, fourth, etc.) memory device may have an on-die thermal sensor and associated toggle logic. Alternatively, at least one memory device on each side of memory module 120 may include an on-die thermal sensor and associated toggle logic. In yet other embodiments, at least one memory device on memory module 120 includes an on-die thermal sensor and associated toggle logic.

Memory controller 130 provides an interface between processor 110 and memory module 120. In some embodiments, memory controller 130 includes thermal throttles 132 and sensor processing logic 134. Sensor processing logic 134 may collect thermal data from storage elements 170-176 and process the collected data. Collecting the thermal data may include issuing a command for the data (e.g., by asserting an appropriate signal) and/or receiving data that is pushed from memory devices 122-128. Processing the thermal data may include, for example, determining maximum temperatures, determining minimum temperatures, determining average (and/or rolling average) temperatures, comparing collected thermal data to various trip points, and the like. In some embodiments, thermal throttles 132 provide thermal control mechanisms for module 120 and/or memory devices 122-128. For example, thermal throttles 132 may limit the rate of reads and writes to memory devices 122-128.

Memory interconnect 150 couples memory module 120 with memory controller 130. In some embodiments, memory interconnect 150 is a multi-drop bus. In alternative embodiments, memory interconnect 150 is a serial interconnect.

Figure 2:
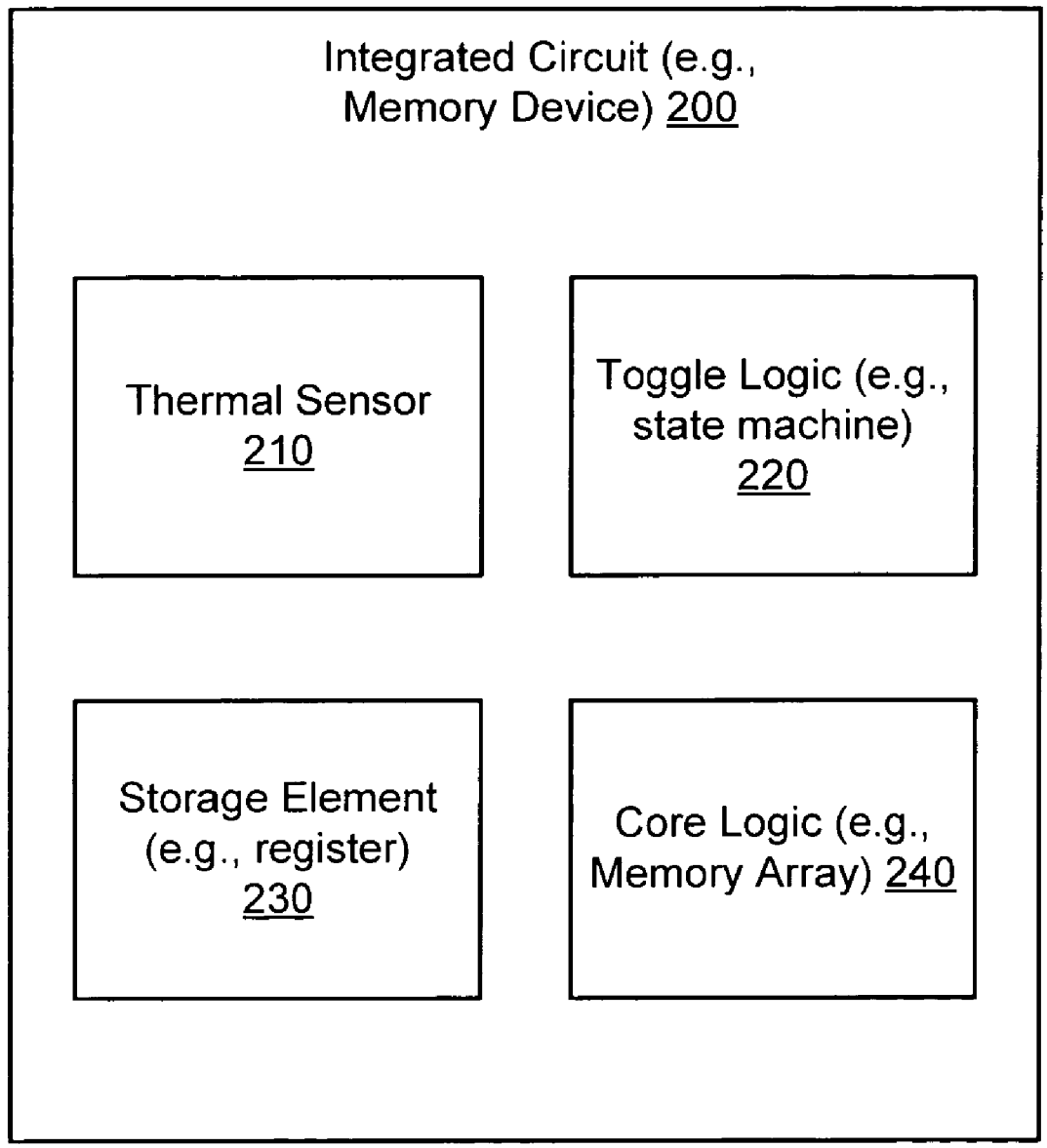
FIG. 2 is a block diagram illustrating selected aspects of an integrated circuited implemented according to an embodiment of the invention.

FIG. 2 is a block diagram showing selected aspects of an integrated circuit (e.g., a memory device), implemented according to an embodiment of the invention. Integrated circuit 200 includes thermal sensor 210, toggle logic 220, storage element 230, and core logic 240. In some embodiments, integrated circuit 200 is a memory device such as a DRAM. In alternative embodiments, integrated circuit 200 may be almost any integrated circuit having an on-die thermal sensor 210.

On-die thermal sensor 210 senses thermal data indicative of the temperature of integrated circuit 200. Sensor 210 may pass the thermal data to storage element 230. In some embodiments, toggle logic 220 transitions thermal sensor 210 among two or more power consumption levels. The two or more power consumption levels may correspond to various states of sensor 210. For example, each of a power on mode, a sense mode, and a power off mode may correspond to a different power consumption level. In some embodiments, toggle logic 220 transitions sensor 210 from one power consumption level to another by transitioning it from one state to another.

Core logic 240 is the core logic of integrated circuit 200. In an embodiment in which integrated circuit 200 is a memory device, core logic 240 may be a memory array. In alternative embodiments, core logic 240 may be any other kind of core logic including, for example, processing logic.

Figure 3:
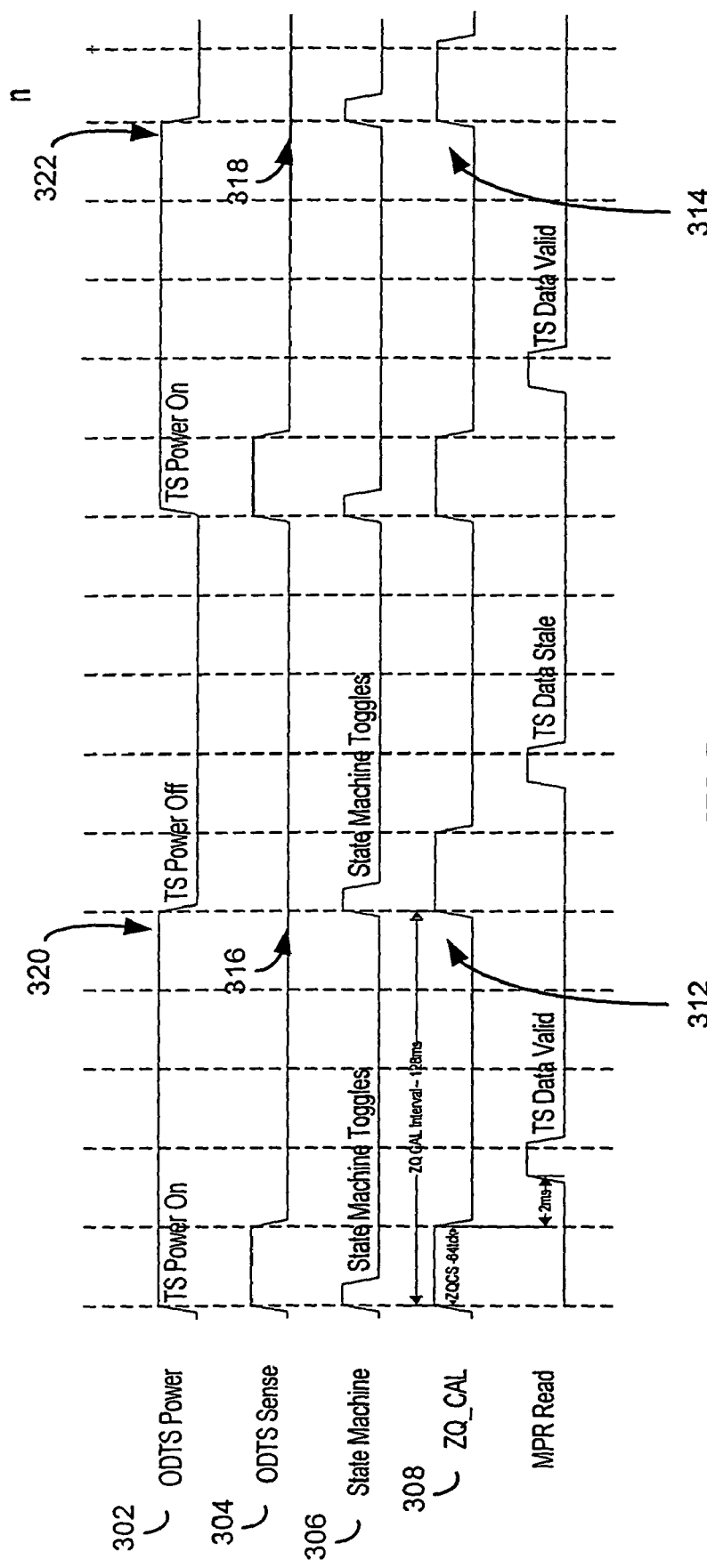
FIG. 3 is a timing diagram illustrating selected aspects of saving power using toggle control according to an embodiment of the invention.

FIG. 3 is a timing diagram illustrating aspects of saving power using toggle control, according to an embodiment of the invention. Line 302 of timing diagram 300 illustrates a thermal sensor being toggled on and off. The sense operation of the sensor is shown in Line 304. Line 306 shows the toggle logic periodically toggling.

In some embodiments, the toggle logic toggles in response to a toggle indication. The toggle indication may be almost any command (e.g., asserted signal) provided by a controller (e.g., memory controller 130, shown in FIG. 1). In some embodiments, the toggle indication is an interconnect calibration command. An "interconnect calibration command" refers to a command to calibrate an interconnect (e.g., memory interconnect 150, shown in FIG. 1). There are a number of advantages to latching the toggle logic to an interconnect calibration command including the fact that using a preexisting command means that there is no need to add a new command. In addition, the memory interconnect is (relatively) quiet during the calibration event so there is very little signaling that might interfere with sensing the temperature.

In some embodiments, the interconnect calibration command is a ZQ calibration (ZQ cal) command. The ZQ cal command refers to a calibration command used to periodically calibrate the DQs in, for example, a double data read (DDR) 3 memory system. There may be a number of different ZQ cal commands including a ZQ cal short (ZQCS) command and a ZQ cal long (ZQCL) command. The ZQCS command may be 64 clock cycles long and the ZQCL may be 512 clock cycles long. Line 308 illustrates a periodic ZQ cal command that may be used as a toggle indication. In alternative embodiments, the toggle indication may be latched to a different command. For example, in alternative embodiments, the toggle indication may be a memory read, a memory write, or nearly any other command and/or signal used by an integrated circuit.

In some embodiments, the toggle logic may skip one or more toggle indications. The term "skipping" a toggle indication refers to skipping one or more toggle indications without sensing the temperature of the integrated circuit. In timing diagram 300, for example, every second toggle indication is skipped. That is, during every second toggle indication (e.g., 312, 314), the sensor does not sense (316, 318) but instead powers off (320, 322). In alternative embodiments, almost any number of toggle indications may be skipped (e.g., 0, 1, 2, . . . , n). In some embodiments, the number of toggle indications that are skipped may be programmatically set. For example, a user may set a value in a register (e.g., an MRS) that indicates how many toggle indications are skipped. The toggle logic may access the value and skip the appropriate number of toggle indications.

FIG. 4 is a state diagram illustrating selected aspects of toggle logic according to an embodiment of an invention. Referring to block 410, a controller (e.g., a memory controller) may periodically read a storage element (e.g., 170-176) to retrieve thermal data. It is to be appreciated that the thermal data stored in the storage element will only be as new as the sense interval. In some embodiments, the sense interval is based, at least in part, on the thermal dissipation of the device. That is, a thermally well behaved (e.g., effectively cooled) system may have a longer sense interval than a system that is well thermally behaved.

In the illustrated embodiment, state diagram 400 has two states (420 and 430). The toggle logic transitions to state 420 in response to a toggle indication such as a ZQ cal command. In some embodiments, the first state of the toggle logic corresponds to powering on the thermal sensor. In response to a subsequent toggle indication, the toggle logic transitions to state 430. State 430 corresponds to putting the sensor in sense mode, sensing the thermal data, passing the thermal data to a storage element, and automatically powering down the thermal sensor subsequent to the sense interval. In the illustrated embodiment, the sensor power up mode is separated from the sense mode. One reason for separating these modes is that some sensors need a certain amount of calibration time between power up mode and sense mode. State diagram 400 includes the power up mode in a different state from the sense mode so that the sensor can calibrate itself during the interval of time between toggle indications.

Block 440 illustrates that, in some embodiments, the toggle logic transitions from one state to another during a memory interconnect calibration quiet time. For example, in some embodiments, the toggle logic transitions states in response to a ZQ cal command. In alternative embodiments, the toggle logic may transition in response to a different toggle indication (e.g., a memory read, a memory write, etc.).

FIG. 5 is a table illustrating selected aspects of a storage element (e.g., a mode register in an MRS) according to an embodiment of the invention. Storage element 500 stores, inter alia, settings for a sensor and/or toggle logic associated with the sensor. Referring to rows 502 and 504, for example, storage element 500 stores a value that may enable or disable an on-die thermal sensor. Rows 506 and 508 store values that determine a number of toggle indications that are skipped. For example, row 506 indicates a setting for skipping every second toggle indication. Similarly, row 508 indicates a setting for skipping two toggle indications between each sense event. In alternative embodiments, toggle logic 500 may have more settings, fewer settings, and or different settings.

Figure 6:
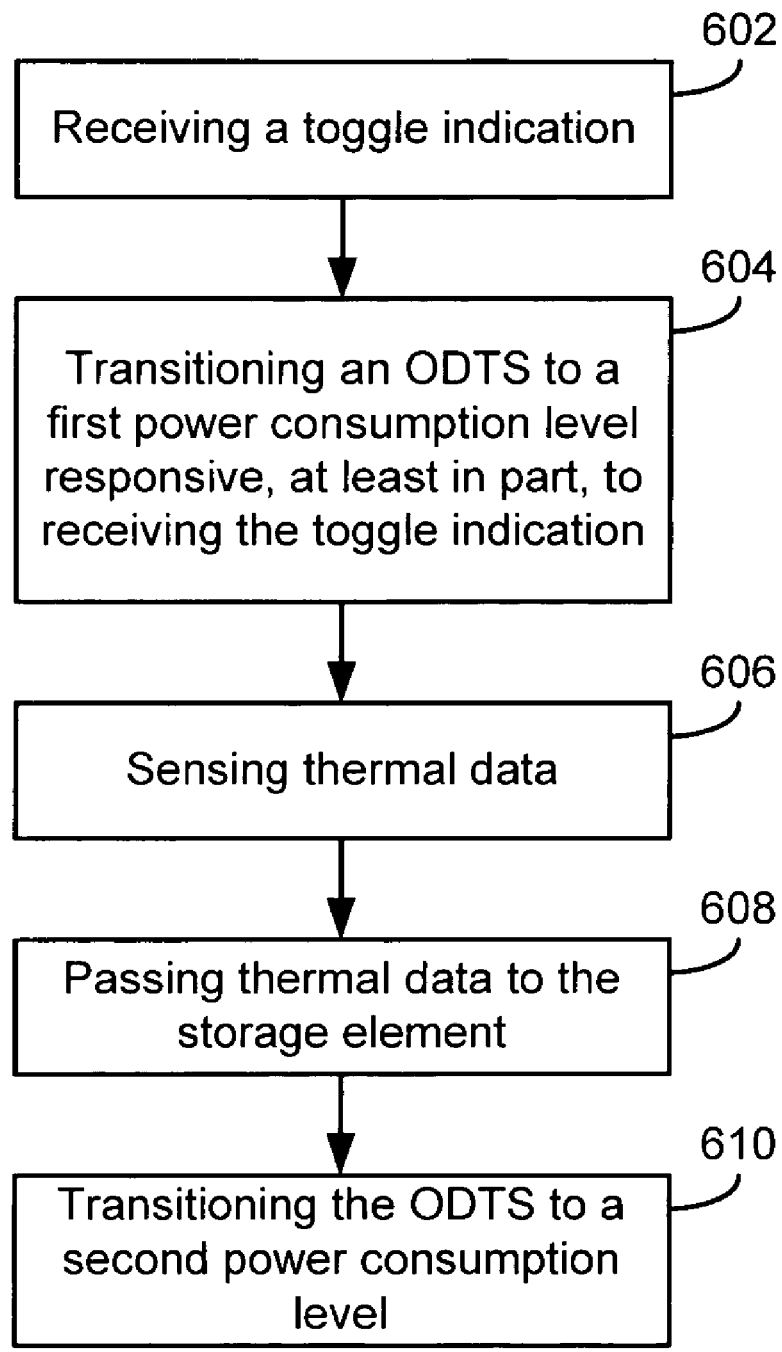
FIG. 6 is a flow diagram illustrating selected aspects of a method for saving power using toggle control, according to an embodiment of the invention.

FIG. 6 is a flow diagram illustrating selected aspects of a method for saving power using toggle control, according to an embodiment of the invention. Referring to process block 602, toggle logic that controls the power consumption level of a thermal sensor receives a toggle indication. In some embodiments, the toggle indication is an interconnect calibration command such as a ZQ cal command. In alternative embodiments, a different toggle indication may be used.

Referring to process block 604, the toggle logic transitions an on-die thermal sensor (ODTS) to a first power consumption level responsive, at least in part, to receiving the toggle indication. In some embodiments, the first power consumption level corresponds to a power on mode. In alternative embodiments, the first power consumption level corresponds to a combination of a power on mode and a sense mode. In yet other alternative embodiments, the first power consumption level may correspond to almost any mode and/or state of the thermal sensor.

Referring to process block 606, the thermal sensor senses the thermal data. The sensed thermal data is passed to a storage element (e.g., storage element 230, shown in FIG. 2) at 608. In some embodiments, logic other than the toggle logic passes the thermal data to the storage element. In alternative embodiments, the toggle logic passes the thermal data to the storage element.

Referring to process block 610, the toggle logic transitions the ODTS to a second power consumption level responsive, at least in part, to a subsequent toggle indication. The subsequent toggle indication is not necessarily the next successive toggle indication following the first toggle indication. That is, in some embodiments, the toggle logic may have a number of stages before it transitions to a different power consumption level. These stages may correspond to, for example, skipping one or more toggle indications without sensing a device temperature.

The second power consumption level may correspond to any of a wide variety of thermal sensor modes and/or states. In some embodiments, the second power consumption level is lower than the first power consumption level. For example, the first power consumption level may correspond to a power on mode and the second power consumption level may correspond to a power down mode. In some embodiments, the ODTS automatically powers down to achieve the second power consumption level.

Figure 7:
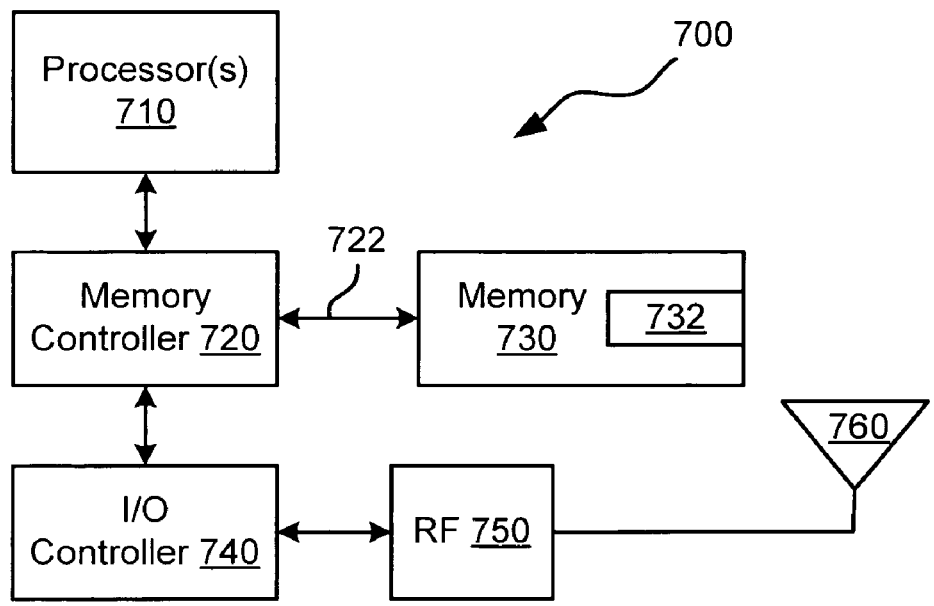
FIG. 7 is a block diagram illustrating selected aspects of an electronic system according to an embodiment of the invention.

FIG. 7 is a block diagram illustrating selected aspects of an electronic system according to an embodiment of the invention. Electronic system 700 includes processor 710, memory controller 720, memory 730, input/output (I/O) controller 740, radio frequency (RF) circuits 750, and antenna 760. In operation, system 700 sends and receives signals using antenna 760, and these signals are processed by the various elements shown in FIG. 7. Antenna 760 may be a directional antenna or an omni-directional antenna. As used herein, the term omni-directional antenna refers to any antenna having a substantially uniform pattern in at least one plane. For example, in some embodiments, antenna 760 may be an omni-directional antenna such as a dipole antenna or a quarter wave antenna. Also, for example, in some embodiments, antenna 760 may be a directional antenna such as a parabolic dish antenna, a patch antenna, or a Yagi antenna. In some embodiments, antenna 760 may include multiple physical antennas.

Radio frequency circuit 750 communicates with antenna 760 and I/O controller 740. In some embodiments, RF circuit 750 includes a physical interface (PHY) corresponding to a communication protocol. For example, RF circuit 750 may include modulators, demodulators, mixers, frequency synthesizers, low noise amplifiers, power amplifiers, and the like. In some embodiments, RF circuit 750 may include a heterodyne receiver, and in other embodiments, RF circuit 750 may include a direct conversion receiver. For example, in embodiments with multiple antennas 760, each antenna may be coupled to a corresponding receiver. In operation, RF circuit 750 receives communications signals from antenna 760 and provides analog or digital signals to I/O controller 740. Further, I/O controller 740 may provide signals to RF circuit 750, which operates on the signals and then transmits them to antenna 760.

Processor(s) 710 may be any type of processing device. For example, processor 710 may be a microprocessor, a microcontroller, or the like. Further, processor 710 may include any number of processing cores or may include any number of separate processors.

Memory controller 720 provides a communication path between processor 710 and other elements shown in FIG. 7. In some embodiments, memory controller 720 is part of a hub device that provides other functions as well. As shown in FIG. 7, memory controller 720 is coupled to processor(s) 710, I/O controller 740, and memory 730.

Memory 730 may include multiple memory devices. These memory devices may be based on any type of memory technology. For example, memory 730 may be random access memory (RAM), dynamic random access memory (DRAM), static random access memory (SRAM), nonvolatile memory such as FLASH memory, or any other type of memory.

Memory 730 may represent a single memory device or a number of memory devices on one or more modules. In some embodiments, at least one of the memory devices includes an on-die thermal sensor and associated toggle logic. The toggle logic may toggle the sensor among two or more power consumption levels. The toggle logic can reduce the power consumption of the sensor by transitioning the sensor to a lower power consumption level under certain conditions.

Memory controller 720 provides data through interconnect 722 to memory 730 and receives data from memory 730 in response to read requests. Commands and/or addresses may be provided to memory 730 through interconnect 722 or through a different interconnect (not shown). Memory controller 730 may receive data to be stored in memory 730 from processor 710 or from another source. Memory controller 720 may provide the data it receives from memory 730 to processor 710 or to another destination. Interconnect 722 may be a bi-directional interconnect or a unidirectional interconnect. Interconnect 722 may include a number of parallel conductors. The signals may be differential or single ended. In some embodiments, interconnect 722 operates using a forwarded, multiphase clock scheme.

Memory controller 720 is also coupled to I/O controller 740 and provides a communications path between processor(s) 710 and I/O controller 740. I/O controller 740 includes circuitry for communicating with I/O circuits such as serial ports, parallel ports, universal serial bus (USB) ports and the like. As shown in FIG. 7, I/O controller 740 provides a communication path to RF circuits 750.

Figure 8:
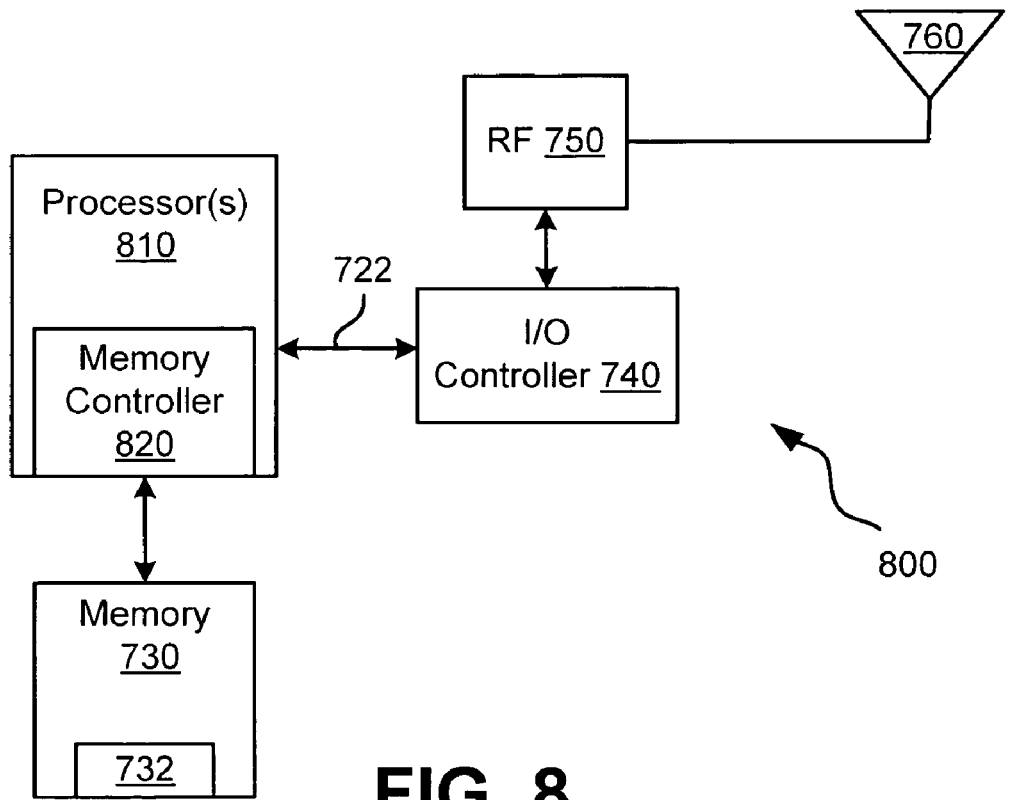
FIG. 8 is a bock diagram illustrating selected aspects of an electronic system according to an alternative embodiment of the invention.

FIG. 8 is a bock diagram illustrating selected aspects of an electronic system according to an alternative embodiment of the invention. Electronic system 800 includes memory 730, I/O controller 740, RF circuits 750, and antenna 760, all of which are described above with reference to FIG. 7. Electronic system 800 also includes processor(s) 810 and memory controller 820. As shown in FIG. 8, memory controller 820 may be on the same die as processor(s) 810. Processor(s) 810 may be any type of processor as described above with reference to processor 710. Example systems represented by FIGS. 7 and 8 include desktop computers, laptop computers, servers, cellular phones, personal digital assistants, digital home systems, and the like.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. An integrated circuit comprising:
    a thermal sensor;
    a storage element coupled with the thermal sensor, the thermal sensor to store thermal data in the storage element; and
    toggle logic to direct a transition from a first level of power consumption by the thermal sensor during operation of the integrated circuit to a second level of power consumption by the thermal sensor during operation of the integrated circuit, wherein the toggle logic to direct the transition responsive, at least in part, to a toggle indication received during operation of the integrated circuit, wherein the toggle indication is an interconnect calibration command to calibrate an interconnect coupled to the integrated circuit.

2. The integrated circuit of claim 1, wherein the interconnect calibration command is a ZQ calibration command.

3. The integrated circuit of claim 1, wherein the toggle logic includes a state machine having a first state corresponding to the first level of power consumption and a second state corresponding to the second level of power consumption.

4. The integrated circuit of claim 3, wherein the first state is associated with a thermal sensor power up mode.

5. The integrated circuit of claim 4, wherein the second state is associated with a thermal sensor sense mode.

6. The integrated circuit of claim 4, wherein the state machine includes N additional states to skip a corresponding N additional toggle indications.

7. The integrated circuit of claim 1, wherein the integrated circuit includes a volatile memory device coupled to the thermal sensor, wherein the thermal sensor to sense a thermal condition of the volatile memory device.

8. The integrated circuit of claim 7, wherein the volatile memory device is a dynamic random access memory device.

9. The integrated circuit of claim 8, wherein the storage element includes a register set.

10. The integrated circuit of claim 9, wherein the register set is a mode register set (MRS).

11. A system comprising:
 a dynamic random access memory (DRAM) device including
  a thermal sensor;
  a register coupled with the thermal sensor, wherein the thermal sensor to store thermal data in the register; and
  toggle logic to direct a transition from a first level of power consumption by the thermal sensor during operation of the integrated circuit to a second level of power consumption by the thermal sensor during operation of the integrated circuit, wherein the toggle logic to direct the transition responsive, at least in part, to a toggle indication received during operation of the integrated circuit, wherein the toggle indication is an interconnect calibration command to calibrate an interconnect coupled to the integrated circuit; and
 a memory controller coupled with the memory device, the memory controller including thermal sensor processing logic to collect temperature information from the thermal sensor.

12. The system of claim 11, wherein the interconnect calibration command includes a ZQ calibration command.

13. The system of claim 11, wherein the toggle indication includes bus calibration command.

14. The system of claim 11, wherein the toggle logic includes a state machine having a first state corresponding to the first level of power consumption and a second state corresponding to the second level of power consumption.

15. The system of claim 14, wherein the first state is associated with a thermal sensor power up mode.

16. The system of claim 14, wherein the state machine further includes N additional states to skip N subsequent toggle indications.

\* \* \* \* \*